United States Patent
Baizley et al.

[11] Patent Number: 6,011,423
[45] Date of Patent: Jan. 4, 2000

[54] VIRTUAL VOLTAGE POWER SUPPLY

[75] Inventors: Arnold E. Baizley, Underhill; Anthony R. Bonaccio, Shelburne; Charles J. Masenas; Steven J. Tanghe, both of Essex Junction, all of Vt.

[73] Assignee: International Business Machines Corporation, Armonk, N.Y.

[21] Appl. No.: 08/862,896

[22] Filed: May 23, 1997

[51] Int. Cl.[7] .................................................. H03K 17/56
[52] U.S. Cl. ........................................ 327/423; 327/589
[58] Field of Search ..................................... 327/390, 534, 327/535, 536, 537, 589, 423; 307/110

[56] References Cited

U.S. PATENT DOCUMENTS

| | | | |
|---|---|---|---|
| 4,535,203 | 8/1985 | Jenkins et al. | 327/424 |
| 4,926,354 | 5/1990 | Pattantyus | 363/98 |
| 5,481,447 | 1/1996 | Caris et al. | 327/536 |
| 5,493,543 | 2/1996 | Kamens | 307/110 |
| 5,521,871 | 5/1996 | Choi | 327/536 |
| 5,672,992 | 9/1997 | Nadd | 327/537 |
| 5,811,850 | 9/1998 | Smayling et al. | 257/335 |
| 5,860,941 | 1/1999 | Saringer et al. | 601/33 |

*Primary Examiner*—Terry D. Cunningham
*Attorney, Agent, or Firm*—Witham, Curtis & Whitham; Eugene I. Shkurko

[57] ABSTRACT

A voltage boosting circuit for an "H-driver," providing for each "pull-up" switch in the H-driver a switching shunt that charges a capacitor from a supply voltage when the "pull-up" switch is open and couples the capacitor directly to the write head when the "pull-up" switch is closed. The side of the capacitor which is not directly coupled to the write head is coupled to the data signal (or its inverse, in the case of the capacitor for the otherwise identical circuit serving the parallel half of the "H-driver") through a buffer which sets the voltage at the signal level (or its inverse), thereby dumping the charge to the write head and elevating the voltage of the write head significantly above the supply voltage. The identical circuit serving the parallel half of the "H-driver" similarly boosts the negative going transition voltage.

8 Claims, 6 Drawing Sheets

VIRTUAL VOLTAGE POWER SUPPLY

BACKGROUND OF THE INVENTION

1. Field of the Invention

The present invention generally relates to write drivers for disk drives, and in particular to circuits for improving the driving voltage applied across write heads for write drivers in an "H" configuration.

2. Background Description

Driver circuits for writing data to magnetic disk drives have been evolving in response to various marketplace and related technological developments. One concern in the trend toward smaller computing equipment has been power dissipation. In order to reduce power consumption, write drivers were configured in an "H" topology, with the write head at the cross-bar of the "H". Switches at the four arms of the "H" (two "pull-up" switches above the cross-bar and two "pull-down" switches below form top and bottom halves, respectively; the two arms to the left of the cross-bar and the two arms to the right form left and right halves, respectively) are controlled by alternating pulses of a data signal so that at any one time only two arms of the "H" are conducting. One conducting arm is in the top half of the "H" and the other is in the bottom half; similarly, one conducting arm is in the left half of the "H" and the other is in the right half. When a data pulse is of one polarity, current flows from the top left arm through the cross-bar from left to right and down the bottom right arm. Similarly, when the data pulse is of the opposite polarity, current flows from the top right arm through the cross-bar from right to left and down the bottom left arm. All current which flows in the "H" configuration flows through the write head at the cross-bar, thereby minimizing power consumption, with the direction of the current through the write head depending on the polarity of the data pulse.

Since the speed bottleneck for a hard disk system is the write driver, it is desirable to have a means to improve the switching time of the write driver current. One technique for improving switching time is to use faster switches, as disclosed in U.S. Pat. No. 5,291,069 to Gooding et al. The Gooding patent describes circuitry for using bipolar transistors in an "H-driver" configuration, in place of field effect transistors.

Write drivers configured in the so called "H-driver" configuration have an inherent limitation to the voltage which can be applied across the differential output nodes. This limits the rate of change of current through an inductive load, such as a write head.

Schemes have been proposed to boost the effective driving voltage by coupling capacitive current into the output. For example, in U.S. Pat. No. 5,331,479 to Madsen there is described a circuit for boosting voltage across the recording write head of a magnetic disk drive during write current transitions. This increased voltage is created by switching a capacitor voltage so that the common reference voltage of the circuit is momentarily driven below ground. This circuit is a single circuit boosting the supply voltage during write transitions and allowing use of a lower voltage power supply. This approach transiently boosts current applied to the output during the transition.

Another approach which uses capacitive coupling to increase voltage to the write head is described in U.S. Pat. No. 4,647,988 to Takehara. However, this technique uses a center tap on the write driver load and pumps that center tap at data transitions which are sensed using a monostable multivibrator. Takehara does not disclose or suggest how write head voltage may be increased for a write driver which retains the power dissipation advantages of an "H" configuration.

SUMMARY OF THE INVENTION

It is therefore an object of the present invention to provide an increased voltage swing to disk drive write heads being driven by "H-driver" circuits.

It is another object of the invention provide voltage increases in "H-driver" circuits which apply to both positive going and negative going voltage transitions.

It is a further object of the invention to improve the switching time of write driver currents in "H-driver" circuits.

According to the invention, and following the parallel structure of the "H-driver," for each "pull-up" switch there is provided a switching shunt that charges a capacitor from a first supply voltage when the "pull-up" switch is open and couples the capacitor directly to the write head when the "pull-up" switch is closed. The side of the capacitor which is not directly coupled to the write head is driven by the data signal (or its inverse, in the case of the capacitor for the otherwise identical circuit serving the parallel half of the "H-driver") through a buffer which sets the voltage at the signal level (or its inverse), thereby dumping the charge to the write head and elevating the voltage of the write head significantly above the first supply voltage. The identical circuit serving the parallel half of the "H-driver" similarly boosts the negative going transition voltage.

One implementation of the invention is a virtual voltage power supply for symmetrically increasing the peaks of both positive going and negative going voltage transitions of an H-driver output. The invention relies upon dual circuits, out of phase with one another, one for the left half and one for the right half of the H-driver. For each half, the top arm of the H-driver is a switched impedance and the bottom arm is a switched current source. The input for the left half is the inverse of the input for the right half, and the outputs for the left and right halves, respectively, are connected to opposite sides of the write head. The differential voltage across the write head is the voltage at the left half output less the voltage at the right half output. Each of these dual circuits includes a charge coupler for taking a charge from a supply voltage, and a switching shunt for alternatively charging the charge coupler from the supply voltage when the switched impedance is closed and then discharging the charge coupler through the write head when the switched impedance is open, thereby boosting the voltage at the write head. The switched impedance and the switching shunt are responsive to the polarity of the input signal.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
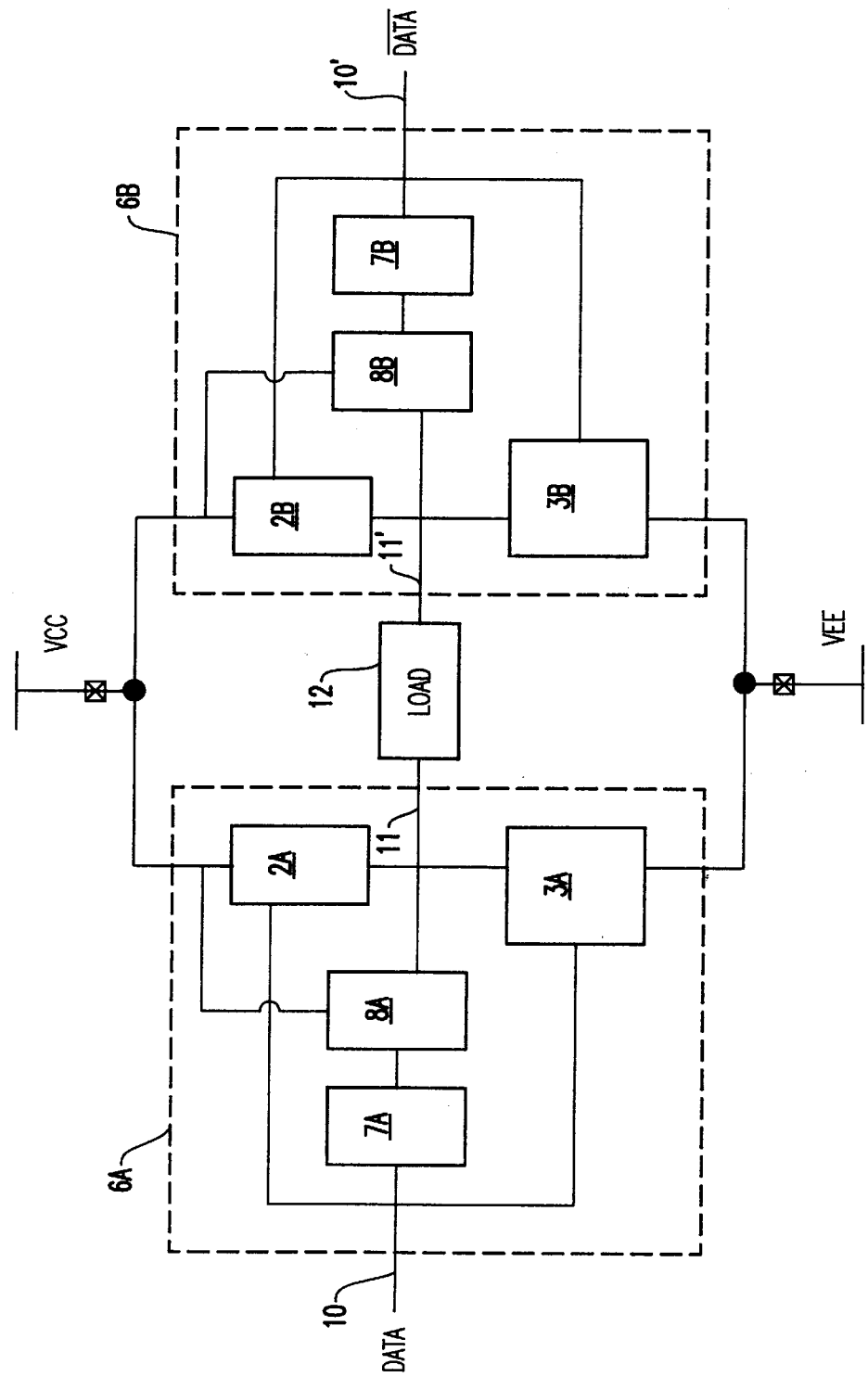
FIG. 1 is a schematic of a traditional H-driver topology modified to show the present invention.

Referring now to the drawings, and more particularly to FIG. 1, there is shown how the circuitry of the present invention is incorporated into the topology of a traditional H-driver circuit. A traditional H-driver circuit topology includes a load 12 at the cross-bar of the "H" together with "pull-up" switches in the arms in the top half of the "H" and "pull-down" switches in the arms in the bottom half of the "H". The dual boost circuits 6A and 6B of the present invention include switched impedances 2A and 2B in the arms in the top half of the "H" and switched current sources 3A and 3B in the arms in the bottom half of the "H". The H-driver is driven by data signal 10 and the inverse of the data signal 10'. Outputs 11 and 11' of the H-driver are applied to the load 12, which is an inductive write head. The invention is characterized by charge couplers 7A and 7B and shunt switches 8A and 8B, whose operation will be described below in connection with FIGS. 1A and 1B, which show high level schematics of boost circuits 6A and 6B, respectively.

Figure 1A:
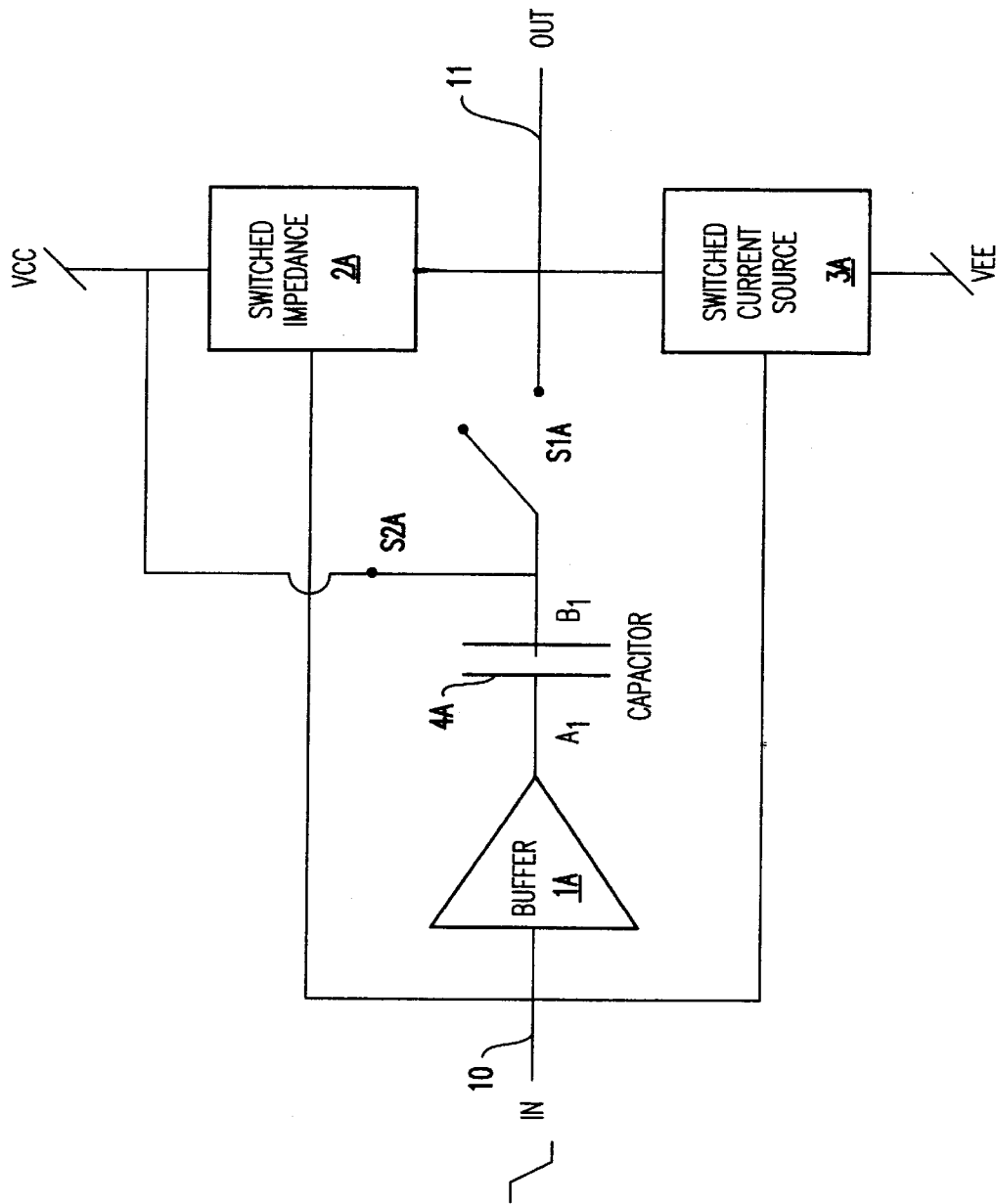
FIG. 1A is a logical schematic for a boost circuit in accordance with the invention serving one half of an H-driver.
Figure 1B:
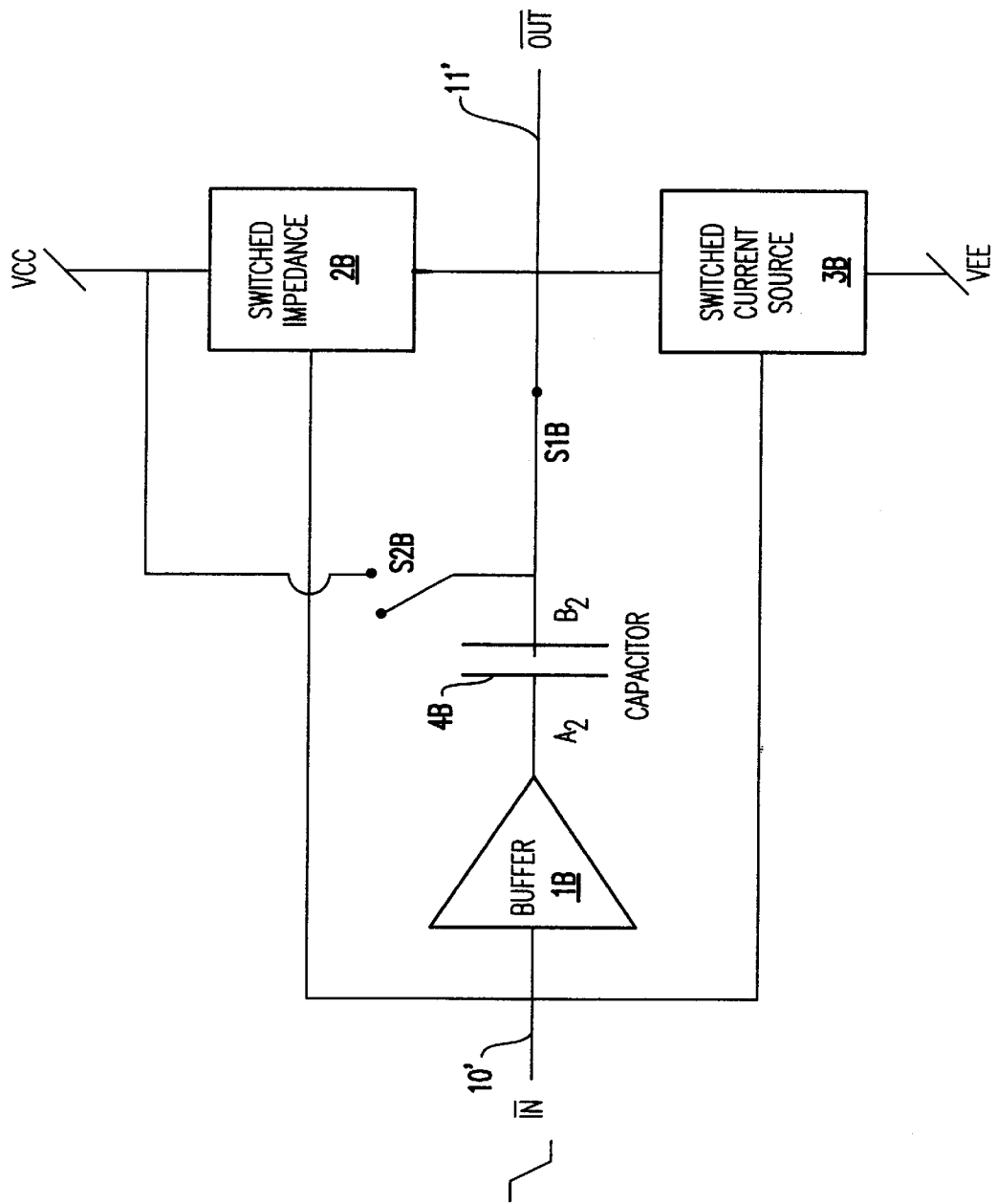
FIG. 1B is a logical schematic showing the switching logic for a parallel boost circuit for the other half of the H-driver, which is 180 degrees out of phase with the logic for FIG. 1A.

FIG. 1A shows a boost circuit in accordance with the invention serving one half of an H-driver. The boost circuit is shown with data signal 10, which is driving switched impedance 2A, in a "down" state. The input 10 to buffer 1A is low, switched impedance 2A is open, switched current source 3A is on, node A1 is low, switch S1A is open and switch S2A is closed. Assuming that the low level of node A1 is zero volts, capacitor 4A is thus charged to VCC through closed switch S2A. FIG. 1B shows the boost circuit serving the other half of the H-driver, which is identical to the first half but is driven by the complement 10' of the input signal 10. When node A1 in FIG. 1A is low, node A2 in FIG. 1B will be high, switched impedance 2B will be closed, switched current source 3B will be off, switch S1B will be closed and switch S2B will be open.

When the input 10 changes state from low to high to signal a positive going transition, switch S2A opens, switch S1A closes, switched impedance 2A is switched to a low impedance, and switched current source 3A is turned off. These circuit conditions are the same as those described for the second half of the H-driver in FIG. 1B, reflecting the parallel structure of the dual boost circuits in accordance with the invention. The buffer 1A causes node A1 to rise and the charge on capacitor 4A is dumped into the load at output 11. The charge from capacitor 4A can be enough to raise the differential output (the difference between the voltage at output 11 and the voltage at output 11') transiently well above VCC, especially if switched impedance 2A conducts only in one direction.

During the negative going transition of the differential output across the write head (the difference in voltage between output node 11 and output node 11'), switch S1A is open so that the discharge at output node 11 is unimpeded by capacitor 4A. Similarly, during the positive going transition of the differential output, switch S1B is open so that the discharge at output node 11' is unimpeded by capacitor 4B.

What has been described for one half of the H-driver is mirrored in the second half of the H-driver, but of opposite phase because the second half of the H-driver is driven by the inverse input 10'. When the inverse input 10' changes state from low to high to signal a negative going transition of data signal 10, switch S2B opens, switch S1B closes, switched impedance 2B is switched to a low impedance, and switched current source 3B is turned off. The buffer 1B causes node B1 to rise and the charge on capacitor 4B is dumped into output node 11'.

Figure 2:
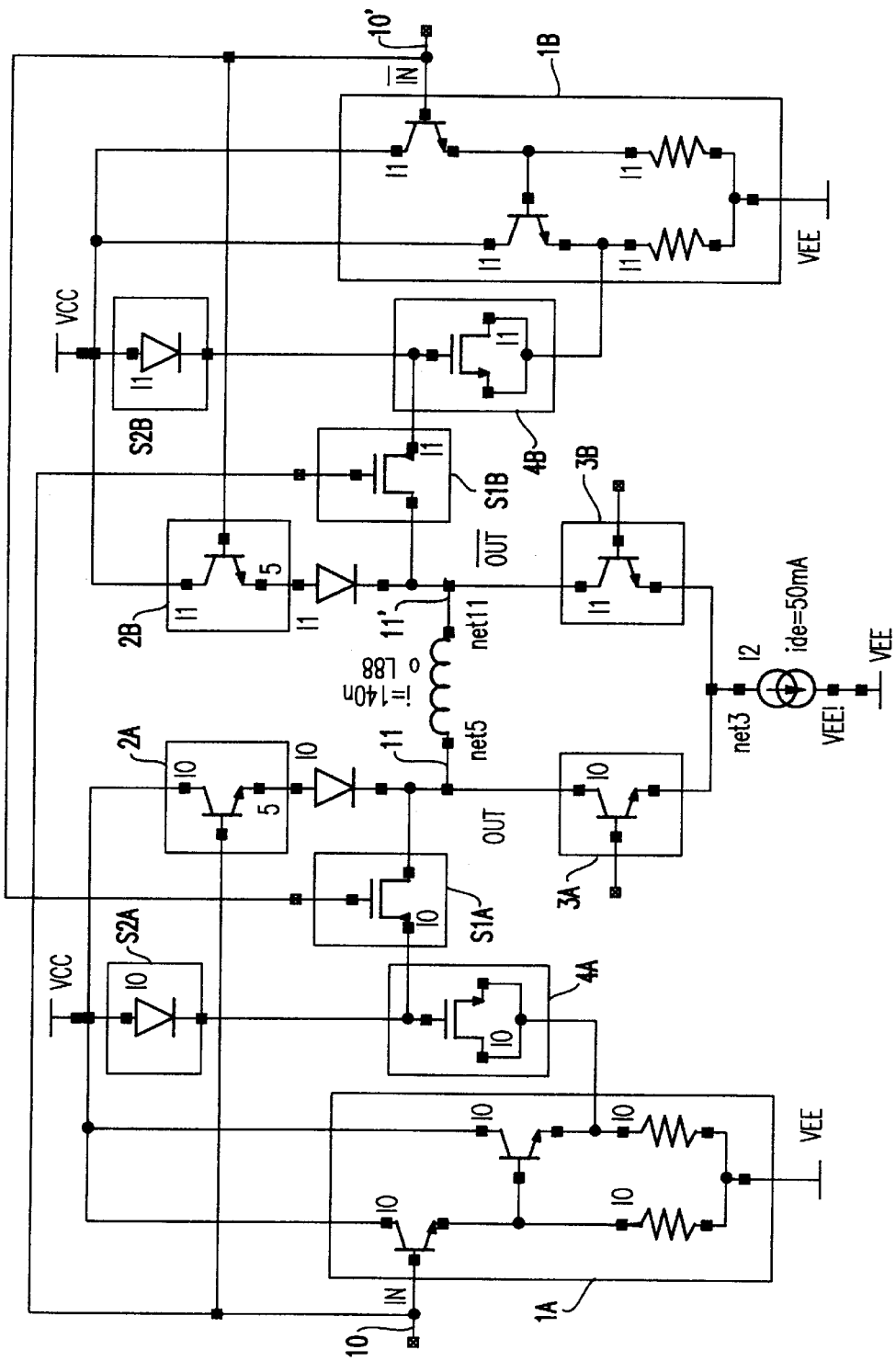
FIG. 2 is a schematic of the boost circuit of the invention, showing both halves of an H-driver.

FIG. 2 is a schematic of the invention showing both halves of the H-driver. Buffer 1A (and 1B) is a darlington emitter follower, capacitor 4A (and 4B) is an n-doped field effect transistor, S2A (and S2B) is a pn diode, S1A (and S1B) is a p-doped field effect transistor, switched impedance 2A (and 2B) is an emitter follower whose emitter is connected in series with a pn junction in order to provide breakdown protection, and current source 3A (and 3B) is an npn device. S1A and 3A are gated by signals out of phase with data signal 10, and S1B and 3B are gated by signals which is in phase with data signal 10.

Figure 2A:
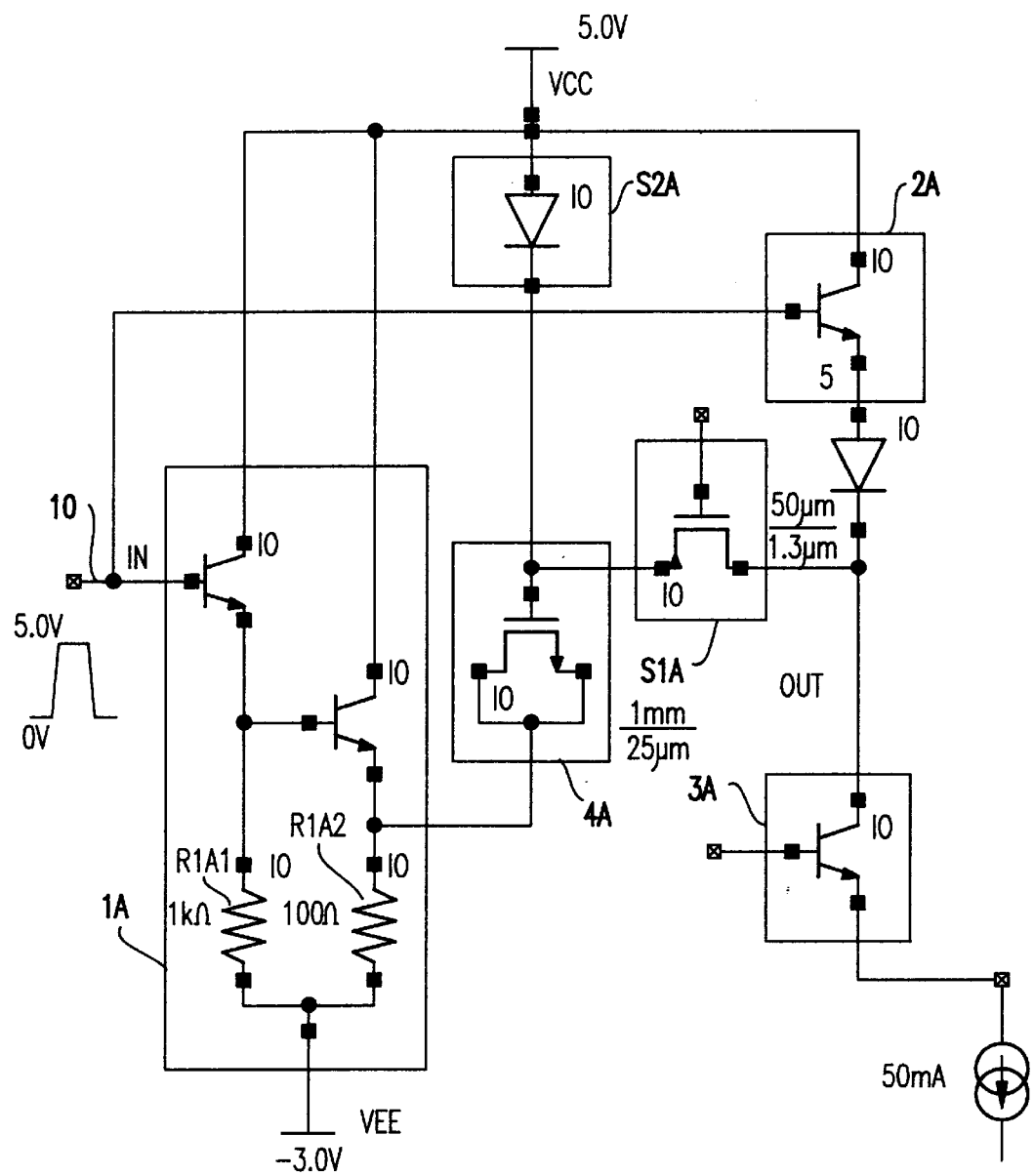
FIG. 2A is a schematic for the boost circuit of the invention, showing one half of an H-driver and annotated to show circuit component values used for the simulated results shown in FIG. 3.
Figure 3:
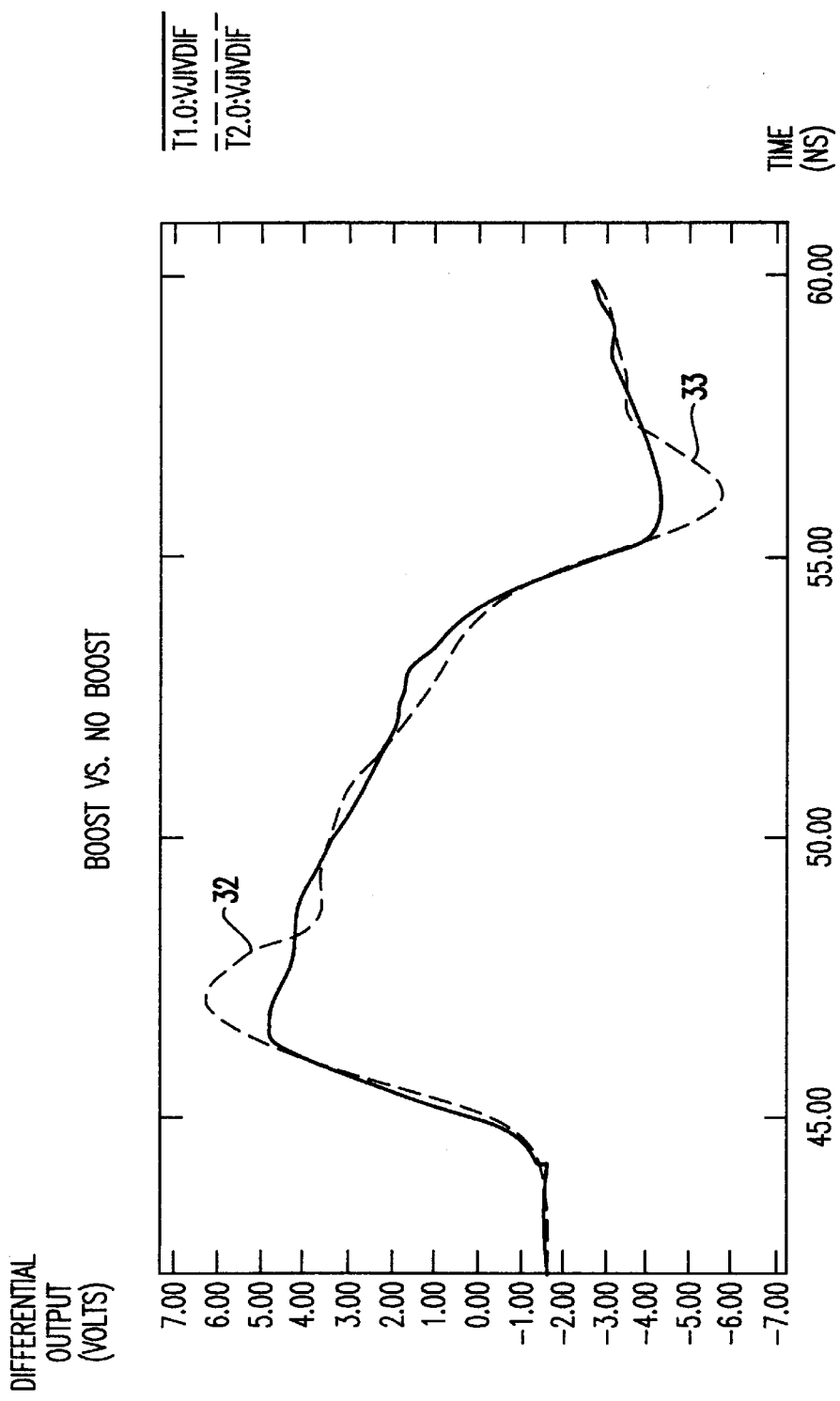
FIG. 3 shows simulated voltage results for an H-driver with (dotted line) and without (solid line) the virtual voltage circuit of the invention.

FIG. 2A shows the left side of FIG. 2, with the circuit parameters used to produce the simulation results shown in FIG. 3. Resistors R1A1 and R1A2 in buffer 1A are at 1 K ohms and 100 ohms, respectively. Capacitor 4A has length to width dimensions of 1 mm/25 μm. Switch S1A has length to width dimensions of 50 μm/1.3 μm. Current source 3A draws 50 mA. Supply voltage VCC is 5.0 volts and supply voltage VEE in −3.0 volts. Input data signal 10 transitions from 0 volts to 5.0 volts. Current source 3A is gated by a signal which is 180 degrees out of phase with data signal 10, but of lower amplitude. The foregoing parameters are mirrored in the right side of the H-driver.

FIG. 3 shows simulated results for a driver with (dotted line) and without (solid line) the boost circuit of the present invention having the parameters of FIG. 2A. The results show that the peak differential output voltage (the peak 32 for the positive going transition and the peak 33 for the negative going transition) is increased by nearly two volts by the addition of the dual boost circuit in accordance with the invention. The slight negative voltage 31 shown at the left axis is due to resistance present in the inductive load.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A symmetrical H-driver boosted voltage circuit, said H-driver being powered by a first supply voltage, comprising first and second boost circuits for first and second halves, respectively, of said H-driver, said H-driver driving an inductive load, each said boost circuit comprising:

charge coupling means;

shunt switching means for alternatively charging and discharging said charge coupling means, responsive to transitions of an input signal, said respective H-driver half being driven by said input signal and having a switched impedance as an upper arm and a switched current source as a lower arm, said input signal driving said switched impedance off for said alternative charging and driving said switched current source off for said alternative discharging, so as to symmetrically boost a differential voltage applied across said inductive load said input signal being a data signal for said first boost circuit and being the complement of said data signal for said second boost circuit, wherein said first boost circuit boosts said differential voltage across said inductive load significantly above said first supply voltage upon positive going transitions of said data signal, and wherein said second boost circuit boosts said differential voltage across said inductive load significantly above said first supply voltage at negative going transitions of said data signal.

2. The circuit of claim 1, wherein each respective said charge coupling means comprises:

charge storing means;

buffering means for setting a voltage at an input of said charge storing means, said voltage being equal to said respective input signal.

3. The circuit of claim 2, wherein each respective said shunt switching means comprises:

first switching means for applying a charge to said charge storing means when said respective input signal is low;

second switching means for transferring said charge to said inductive load when said respective input signal is high.

4. The circuit of claim 3, wherein each respective said buffering means is a darlington emitter follower, each respective said charge storing means is an NFET, each respective said first switching means is a pn diode, each respective said second switching means is a PFET, and said inductive load is a magnetic write head.

5. A method for generating a symmetrical H-driver boosted voltage said H-driver having first and second halves and driving an inductive load, comprising the steps of:

coupling a charge from a first supply voltage to first and second charge couplers connected to said H-driver, said H-driver having first and second halves corresponding to said first and second charge couplers, each said H-driver half having a switched impedance as an upper arm and a switched current source as a lower arm;

alternatively charging and discharging each said charge coupler, responsive to transitions of a respective input signal, said input signal also driving said respective H-driver half, said respective input signal being a data signal for said first half of said H-driver and being the complement of said data signal for said second half of said H-driver, said respective input signal driving said respective switched impedance off for said respective alternative charging step and driving said respective switched current source off for said respective alternative discharging step, so as to symmetrically boost said differential voltage across said inductive load significantly above said first supply voltage upon both positive going and negative going transitions of said data signal.

6. The method of claim 5, wherein each respective said coupling step is implemented with:

a capacitor;

a buffer for setting a voltage at an input of said capacitor, said voltage being equal to said respective input signal.

7. The method of claim 6, wherein each respective said charging and discharging step comprises the further steps of:

applying a charge to said capacitor when said respective input signal is low;

transferring said charge to said inductive load when said respective input signal is high.

8. The method of claim 7, wherein each respective said buffer is a darlington emitter follower, each respective said capacitor is an NFET, each respective said applying step is implemented with pn diode, each respective said transferring step is implemented with a PFET, and said inductive load is a magnetic write head.

* * * * *